(12) United States Patent
Rheem

(10) Patent No.: US 6,401,003 B1
(45) Date of Patent: Jun. 4, 2002

(54) ALARM SYSTEM FOR SEMICONDUCTOR DEVICE FABRICATION FACILITY

(75) Inventor: Byeong-ki Rheem, Kyungki-do (KR)

(73) Assignee: Samsung Electronics Co., Ltd., Suwon (JP)

( * ) Notice: Subject to any disclaimer, the term of this patent is extended or adjusted under 35 U.S.C. 154(b) by 0 days.

(21) Appl. No.: 09/228,036

(22) Filed: Dec. 24, 1998

(30) Foreign Application Priority Data

Dec. 30, 1997 (KR) .............................. 97-79192
Dec. 8, 1998 (KR) .............................. 98-53773

(51) Int. Cl.$^7$ .............................................. G06F 19/00
(52) U.S. Cl. ........................................ 700/121; 700/80
(58) Field of Search ........................... 700/79–82, 121, 700/123, 213, 39, 116; 340/500, 525

(56) References Cited

U.S. PATENT DOCUMENTS

| | | | | |
|---|---|---|---|---|
| 4,962,371 A | * | 10/1990 | Repp et al. ................. | 340/525 |
| 5,319,353 A | * | 6/1994 | Ohnishi et al. ............. | 340/525 |
| 5,511,005 A | * | 4/1996 | Abbe et al. ................. | 700/121 |
| 5,801,634 A | * | 9/1998 | Young et al. ............... | 340/635 |
| 5,913,978 A | * | 6/1999 | Kato et al. .................. | 118/719 |
| 6,207,936 B1 | * | 3/2001 | De Waard et al. .......... | 219/497 |

* cited by examiner

*Primary Examiner*—Leo P. Picard
*Assistant Examiner*—Kidest Bahta
(74) *Attorney, Agent, or Firm*—Volentine Francos, PLLC

(57) ABSTRACT

An alarm system for a semiconductor device fabrication facility for monitoring the current operation state of the facility performing a process, such as ion-implantation, includes a lamp tower which is visibly recognizable from a distance via lighted lamps. The alarm system includes a logical circuit for executing logical-combination based on at least one input signal indicating respective operation states of the facility; and a driver which outputs at least one driving signal for driving a lamp based on the result from the logical circuit. The number of the lamps is identical to the number of driving signals output from the driver based on a one-to-one correspondence, and each of the lamps indicates a particular result for the respective operation states of the facility.

15 Claims, 2 Drawing Sheets

FIG.3

| operation state | | first state (no cassette) | second state (cassette load) | third state (load) | fourth state (ion-implantation) | fifth state (ion-implantation error) | sixth state (ion-implantation stand-by) |
|---|---|---|---|---|---|---|---|
| input signal | A: commencement signal | 1 | 1 | 0 | 0 | 1 | 0 |
| | B: ready signal | 1 | 0 | 0 | 0 | 0 | 0 |
| | C: operation signal | 0 | 1 | 1 | 0 | 0 | 1 |
| | D: stand-by signal | 0 | 0 | 1 | 1 | 0 | 1 |
| output signal | yellow | ON | ON | OFF | ON | OFF | OFF |
| | green | OFF | OFF | ON | ON | ON | ON |
| | red | OFF | ON | OFF | OFF | ON | OFF |

ALARM SYSTEM FOR SEMICONDUCTOR DEVICE FABRICATION FACILITY

BACKGROUND OF THE INVENTION

1) Field of the Invention

The present invention relates to an alarm system for a semiconductor device fabrication facility, and more particularly, to an alarm system to allow the operation state of a particular semiconductor device fabrication facility, such as an ion-implantation facility, to be easily checked by installing a lamp tower which is visually recognizable from a distance.

2) Description of the Related Art

Generally, semiconductor devices are manufactured via a plurality of processing steps, including diffusion, oxidation, photo-lithography, ion-implantation, and the like. These processing steps may be performed repeatedly and in a certain order. Each processing step may require a specific processing condition according to the process and its corresponding facility for the operation.

However, the processing condition and the operation state in the facility should be precisely checked every time in order to facilitate the efficient operation in the facility, and to prevent processing malfunction, which might cause a big accident in the fabrication facility.

Typically, the processing state or the operation state is checked via a monitoring system, and the monitored results can be visually viewed via an operation panel. However, the conventional monitoring system has a disadvantage, i.e., the processing state or the operation state can be checked and monitored on the operation panel, but an operator a short distance away from the spot cannot recognize the operation state easily and exactly.

Especially when an operation error occurs in the facility while the operator is located at a distance, the operator cannot recognize the operation error quickly, thereby causing a mass production of inferior products.

For the ends, sometimes an alarm sound can be used in case of a malfunction, but it cannot be heard easily because of the noise around, and the alarm sound was not an efficient method to monitor and recognize the various operation states.

Therefore, there has been a demand for an alarm system for allowing the operator to easily and visually recognize the operation state in the facility.

SUMMARY OF THE INVENTION

The present invention is directed to provide an alarm system for allowing an operator to be able to visually and easily recognize each of the operation states of a specific process in its specific facility, or the state of the facility carrying out the specific process even a certain distance away from the operation panel in the facility.

To achieve these and other advantages and in accordance with the present invention as embodied and broadly described is an alarm system for semiconductor device fabrication facility. The alarm system includes a logical-combination means for executing a logical-combination on receipt of at least one input signal for the respective operation states in a specific semiconductor device fabrication facility; a driving means for outputting at least one driving signal for driving a lamp on receipt of the result from the logical-combination means; and a lamp tower having lamps. The number of the lamps is identical to the number of driving signals outputted from the driving means, based on a one-to-one correspondence, and each of the lamps indicates its own particular result for the respective operation state in the semiconductor device fabrication facility by the respective driving signals.

The number of the output signals from the logical-combination means, the number of the driving signals from the driving means, and the number of the lamps of the lamp tower are all one-to-one corresponding. The lamps emit all different colors of light respectively.

Preferably, the input signals are inputted into the logical-combination means via a photocoupler for to provide electrical isolation between the input signals and the output signals in order to prevent signal interference by the fabrication facility and the alarm system.

Meanwhile, the semiconductor device fabrication facility employing an alarm system according to the present invention includes a supply chamber for supplying a cassette having wafers to be processed for a specific process, a process chamber for carrying out a specific process, and a load lock chamber displaced between the supply chamber and the process chamber in which the transferred cassette is held.

It is to be understood that both the foregoing general description and the following detailed description are exemplary and explanatory and are intended to provide further explanation of the invention as claimed.

BRIEF DESCRIPTION OF THE DRAWINGS

Further objects, features and advantages of the present invention will become apparent from the following detailed description of preferred embodiment thereof made with reference to the accompanying drawings, of which:

FIG. 3 shows signals of the ion-implantation facility employing one embodiment of the present invention, which discloses operation states of the facility and respective input signals corresponding thereto, and the results shown in the lamp tower.

DETAILED DESCRIPTION OF THE PREFERRED EMBODIMENT

A preferred embodiment of the present invention will now be described in detail with reference to the accompanying drawings.

The present invention provides a lamp tower for allowing operators to be able to easily and visually recognize the operation state of any one of specific semiconductor device fabrication facilities while a certain distance away from where a specific process takes place, and also, logical circuits for the alarm system for these ends. In other words, the colors of the lamps of the lamp tower vary depending on the respective operation states in the facility.

The present invention can be employed on various processes for semiconductor device fabrication, for example, a wafer process such as oxidation, deposition, photolithography, ion-implantation, and diffusion, etc., and also, a single crystalline wafer fabrication process before the above wafer processing, and the testing, the cutting, and the bonding for the wafer after the above processes.

In the embodiment of the present invention which will be described below, the alarm system is applied on an ion-implantation facility, which is a model manufactured by VARIAN COM. (Model name:VARIAN 350 D/300XP). Typically, the ion-implantation facility is used to inject specific ion impurities onto a certain portion of the semiconductor wafer in order to change the electrical characteristics of the injected portion on the target subject. In the ion-implantation facility, the ion impurities extracted from an ion source pass through a mass analyzer by which some group of only ion impurities having a specific mass is selected, and accelerated. The accelerated ion impurities of the group are implanted on the wafer placed on an end station inside a process chamber in which an ion-implantation process is carried out. At this time, the process chamber is maintained in a certain vacuum state, and a load lock chamber is connected as a place where the wafers are held for a certain period of time before going into the process chamber, to facilitate easier loading and unloading of the wafers.

Figure 1:
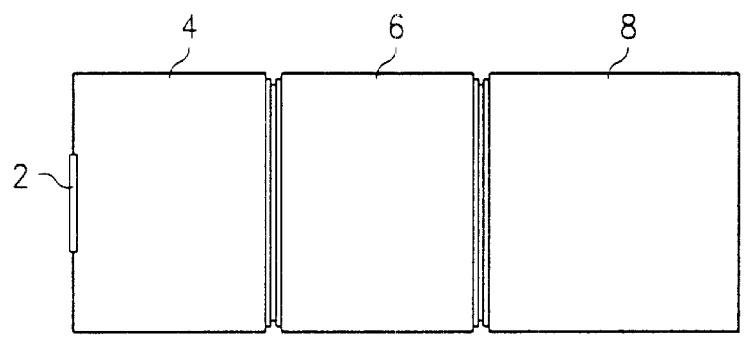
FIG. 1 is a schematic view showing the chambers in a semiconductor device fabrication facility for carrying out an ion-implantation process according to one embodiment of the present invention.

FIG. 1 is a schematic view showing chambers of the ion-implantation facility to which one embodiment of the present invention is applied.

As shown in FIG. 1, a process chamber 8 in which the ion-implantation process is carried out for wafers is connected to a load lock chamber 6 for supplying wafers to be processed to the process chamber 8. The load lock chamber 6 is connected to a supply chamber 4 into which the wafers to be processed are supplied by an operator through a door 2. Between the supply chamber 4 and the load lock chamber 6, and between the load lock chamber 6 and the process chamber 8, respectively there is provided a gate for the passage of the wafers. On each of the chambers, there is provided a vacuum line (not shown) in order to facilitate the easy transfer of the wafers.

Referring to FIG. 1, the operation states of the facility can be classified as below based on the wafer transfer before/after the ion-implantation process.

1) a first state (no cassette), where a cassette having wafers to be processed is not supplied into the supply chamber 4, i.e., the cassette is not present inside the supply chamber 4.

2) a second state (cassette load), where a cassette having wafers is present inside the supply chamber 4.

3) a third state (load), which refers the time period from the time when the cassette having wafers inside the supply chamber 4 is transferred into the load lock chamber 6 by means of a transfer means, to the time right before ion-impurities are injected into the wafers transferred from the load lock chamber 6 to the process chamber 8.

4) a fourth state (ion-implantation), where the ion-implantation process is performed for the wafers inside the process chamber 8.

5) a fifth state (ion-implantation error), where ion-implantation error occurs during the ion-implantation process,.

6) a sixth state (ion-implantation stand-by), which refers the time period from the time when the ion-implantation process for a single wafer is completed, to the time right before the ion-implantation process is resumed for a new wafer.

Besides the above six states, a seventh state (unload) may be further added in order to define the period from the time when the ion-implantation process is completed for the last wafer, to the time when the wafers are unloaded into the cassette inside the load lock chamber 6, and the cassette is moved to the supply chamber 4. In other words, the above seventh state (unload) is an opposite state to the third state (load). However, the seventh state can be considered the same as the third state (load), with no need to be classified separately.

Alternatively, the third state (load) and the seventh state (unload) together can be considered as a same state, classified then as the sixth state (ion-implantation stand-by).

Once the ion-implantation process starts with supplying the cassette into the supply chamber 4, and pushing a START button on the operation panel, the operation of the ion-implantation process begins from the above third state, and therefore, for an operator standing a certain distance away from the operation panel, it may be necessary-only to recognize three of the respective classified operation states, i.e. ion-implantation stand-by, ion-implantation, and ion-implantation error.

Above classification of the operation states for ion-implantation is only an example of state classification according to a preferred embodiment of the present invention, and various embodiments can be possible with the classification of more or fewer operation states. Moreover, for many semiconductor device fabrication facilities other than an ion-implantation facility, various classifications of the operation states and the facility states can be made according to the characteristics of the specific fabrication processes executed in the respective fabrication facilities.

In the meanwhile, according to the above embodiment of the present invention, four input signals are used for the above six operation states in the alarm system of the ion-implantation facility to distinguish each of the operation states from the first state to the sixth state. In addition, the embodiment of the present invention employs a lamp tower having three lamps emitting different colors of light, in order to function as an alarm system regarding the status of the ion-implantation process, and showing each of the six operation states by its corresponding lamp color as classified as above. In other words, four input signals pass through a logical-combination to identify each of the six operation states, and three lamps are used to show the results.

However, the scope of the present invention is not limited to this embodiment, and it is possible to vary the number of the input signals, the number of the operation states, and the number of the lamps, etc.

FIG. 3 shows waveforms and a truth table of the four input signals for each of the above six operation states from the first operation state to the sixth operation state.

Referring to FIG. 3, the description for the four input signals will be made. A commencement signal (A) is generated at the above third, fourth, and sixth states (namely, low level states at the waveforms of FIG. 3). A ready signal (B) is generated at the second, third, fourth, fifth, and sixth states. An operation signal (C) is generated at the first and the fourth states. A stand-by signal (D) is generated at the first, the second, and the fifth states.

As shown in FIG. 3, a high level in the waveforms is indicated as "1" in the truth table, and a low level is indicated as "0".

Figure 2:
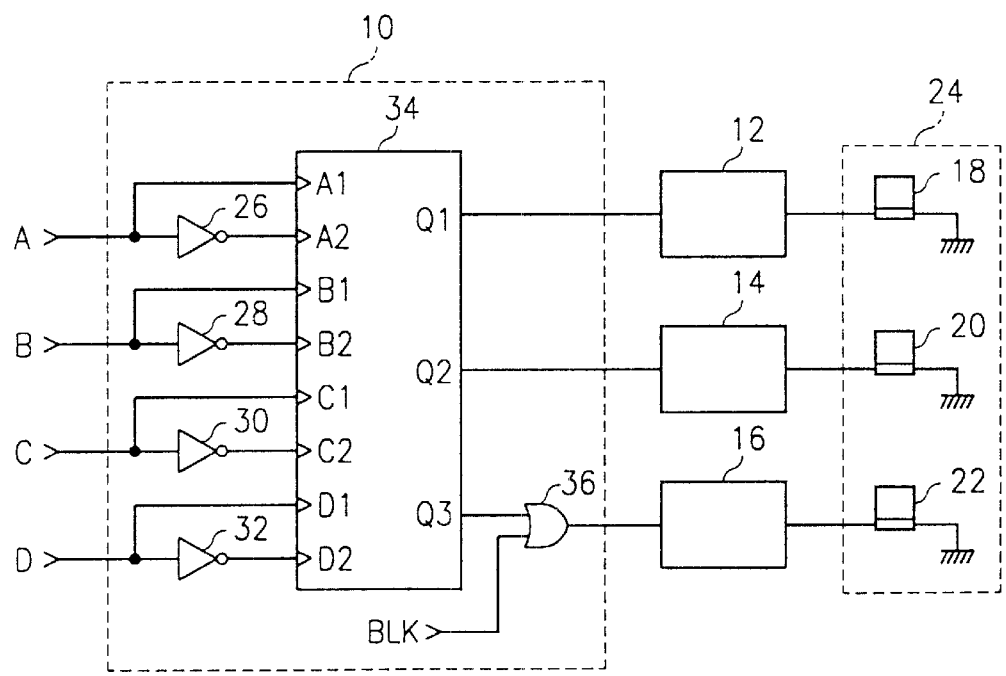
FIG. 2 is a block diagram showing an alarm system for the semiconductor device fabrication facility according to one preferred embodiment of the present invention.

FIG. 2 schematically shows an alarm system for a semiconductor device fabrication facility according to one embodiment of the present invention, and roughly, it comprises an input, a logical-combination part 10, driving units 12,14,16, and a lamp tower 24.

The four input signals of FIG. 3 are inputted via the input. The input signals can be directly inputted on the operation panel of the ion-implantation facility according to the embodiment of the present invention. However, preferably, a photocoupler (not shown) can be provided on the operation panel in order to prevent malfunctioning in the ion-implantation facility as a main unit due to signal transmitting errors generated by interference from the signals transmitted back from the alarming system of the present invention as a supplementary unit, and also, to get electrical isolation. The photocoupler translates an electrical signal into a photo signal using a light emitting diode which photo signal is then sent to a photo diode or transistor. The received photo signal is translated back into an electrical signal by the photo diode or transistor.

The logical-combination part 10 executes logical-combination on the input signals for indicating respective operation states applied from the input, and determines the present operation state. The logical-combination part 10 includes a combinator 34 therein, and the input signals (A,B,C,D) for the respective operation states are inputted into the combinator 34 from the input part with non-inverting forms (A1, B1, C1, D1) and inverting forms (A2, B2, C2, D2) via inverters (26,28,30,32), and the combinator 34 executes logical-combination of the input signals so as to produce the results as shown in FIG. 3. In other words, the input signals (A,B,C,D) for indicating the respective operation states are inputted via the input into the combinator 34 in inverting and non-inverting form, and the combinator 34 executes logical-combination of the input signals, and outputs the results via output terminals Q1, Q2, Q3 as three different individual output signals.

The output signals, outputted via the output terminals Q1, Q2, Q3, are applied into driving parts 12,14,16 corresponding to the output terminals Q1, Q2, Q3 on a one-to-one basis respectively, and the driving parts 12,14,16 also output driving signals for driving the three lamps 18,20,22 of the lamp tower 24 respectively, the three driving parts 12,14,16 also being related with the three lamps 18,20,22 on a one-to-one corresponding basis.

In a more detailed description, the logical-combinator 34 executes a logical-combination of the input signals for the respective operation states of a specific facility, and one result is outputted via a first output terminal Q1 and passed through a first driving part 12 so as to output a driving signal for driving, for example, a first lamp 18 in the lamp tower 24, the first lamp 18 emitting yellow color. In the same way, another result from the above logical-combination passes through a second output terminal Q2 and a second driving part 14 in sequence, so as to drive a second lamp 20 emitting green color. Another result from the above logical-combination passes through a third output terminal Q3 and a third driving part 16 in sequence, so as to drive a third lamp 22 emitting red color.

Each of the lamps 18,20,22 of the lamp tower 24 turns lights on or off according to the driving signal from each of the driving parts 12,14,16. In other words, in order to turn on a light of one of the lamps 18,20,22, a low level output signal is applied from a corresponding output terminal Q1, Q2, Q3 to a corresponding driving part 12,14,16, and a high level driving signal is applied from the corresponding driving part 12,14,16 to a corresponding lamp 18,20,22. On the other hand, in order to turn off a light of one of the lamps 18,20,22, a high level output signal is applied from a corresponding output terminal Q1, Q2, Q3 to a corresponding driving part 12,14,16, and a low level driving signal is applied from the corresponding driving part 12,14,16 to a corresponding lamp 18,20,22.

For example, describing the fourth state of ion-implantation, the results of the fourth state are indicated as shown in FIG. 3, i.e. the first lamp 18 emitting yellow color is ON, the second lamp 20 emitting green color is ON, and the third lamp 22 emitting red color is OFF. To this end, as the input signals applied to the combinator 34, "0" is inputted for the commencement signal (A), "0" is inputted for the ready signal (B), "0" is inputted for the operation signal (C), and "1" is inputted for the stand by signal (D).

Then, as a result of logical-combination on the input signals by the combinator 34, low level signals are produced for the output signals of the first output terminal Q1, and the second output terminal Q2. On the other hand, a high level signal is produced for the output signal of the third output terminal Q3. Therefore, low level signals are applied to the first driving part 12 and the second driving part 14 respectively, and the first driving part 12 and the second driving part 14 each output a high level driving signal to the first lamp 18 and the second lamp 20 respectively so as to turn on the first lamp 18 and the second lamp 20. Meanwhile, the third driving part 16, on receipt of a high level output signal from the third output terminal Q3, outputs a low level driving signal to the third lamp 22, which turns the light off.

Meanwhile, for the first, the second, the third, the fifth, and the sixth states, as shown in FIG. 3, the input signals (A, B, C, D) corresponding to the respective operation states are applied, and pass through the above processing so as to turn on or off the corresponding lamps.

Meanwhile, in order to make a specific lamp blink (turn on/off), for example, OR-gate 36 is provided on the third output terminal Q3 of the combinator 34 for combining the output signal from the third output terminal Q3 with a pulse signal (BLK) having a certain frequency so as to apply a blanking signal to the third driving part 16 for blinking (turning on/off) the third lamp 22. Of course, it becomes apparent to make all lamps blink, and not remain on or off, by applying the above same principle.

Meanwhile, the choice of having the light turn on or off at each lamp, and the selection of the light color at each lamp as shown in FIG. 3 can be determined by operators ' preferences.

In the embodiment of the present invention employed on the ion-implantation process, once an operator confirms the first and the second operation state from the operation panel, and pushes a START button on the operation panel to make the process proceed into the third operation state, the operator is generally located a distance away to check the processes at the other facilities while the ion-implantation is executed for all of the wafers in the cassette, for example, 25 wafers.

Therefore, it may be enough to visually confirm the operation states after the third operation state from a distance away. So, it may be arranged in such a manner that the lamps of the lamp tower emit just three different light colors to identify only the third, the fourth, the fifth, and the sixth operation states without the classification of the first and the second operation state as shown in FIG. 3.

In one embodiment, the third and the sixth operation state are indicated as identical light colors of a lamp, only distinguished from the fourth operation state (ion-implantation) and the fifth operation state (ion-implantation error).

Meanwhile, in a preferred embodiment, the green lamp 20 turns off in the first and the second operation states before the ion-implantation, and turns on from the third operation state, and remains on until the sixth operation state.

With the green lamp 20 on, the yellow lamp 20 additionally turns on at the beginning of the substantial ion-implantation. In case of operation error, the yellow lamp 20 turns off, and the red lamp 22 turns on as a typical signal indicating an emergency state.

Also, preferably, the red lamp 22 is arranged to blink as described above because the malfunction of the process, such as an ion-implantation error, requires a prompt attention thereto.

As described above for the embodiment of the present invention, the operation states in the ion-implantation facility are divided into six steps of the operation states, from the first to the sixth including the loading of the wafers, ion-implantation, etc. The operation states are identified respectively only via four input signals (A, B, C, D) and three lamps 18,20,22, their colors of light being all distinguished.

However, the scope of the present invention is not limited to this embodiment, and various changes and modification can be possible within the spirit of the present invention. In other words, within the ranges to satisfy alarm functions according to the characteristics of each fabrication facility, the selection of the proper number of processes, and operation states can be possible, and the number of the input signals, waveforms, and the number or the light color of the lamps according thereto can be varied.

Therefore, according to the present invention, an operator can monitor the operation states of each fabrication facility even from a certain distance away from an operation panel, and visually with naked eyes. As a result, the operation efficiency of the facility can be optimized, the safety of the processes is increased, and thereby, the production yield is improved.

In the accompanying drawings and specification, there have been disclosed typical preferred embodiments of the invention and, although specific terms are employed, they are used in a generic and descriptive sense only and not for purposes of limitation, the scope of the invention being set forth in the following claims. Thus, it is intended that the present invention cover the modifications and variations of this invention provided they come within the scope of the appended claims and their equivalents.

♣ Description of the numerals in the drawings

| |
|---|
| 2; door |
| 4; Supply chamber |
| 6; load lock chamber |
| 8; process chamber |
| 10; logical-combination part |
| 12,14,16; driving part |
| 24; lamp tower |
| 18,20,22; lamp |
| 34; cotnbinator |
| 26,28,30,32; inverter |
| 36; OR-gate |
| Q1,Q2,Q3; output terminal |

What is claimed is:

1. An alarm system for a semiconductor device fabrication facility comprising:
   a logical-combination means for executing logical-combination on receipt of at least one input signal for respective operation states in a specific semiconductor device fabrication facility to produce at least one logical-combination result;
   a driving means for outputting N driving signals on receipt of the result from the logical-combination means, N being an integer number greater than zero; and
   a lamp towers receiving said driving signals and having N lamps, each of said lamps corresponding to one of said driving signals, each lamp indicating a particular result for the respective operation states in the semiconductor device fabrication facility.

2. The alarm system of claim 1, wherein the logical-combination means produces N logical-combination results and wherein the logical-combination results, the driving signals from the driving means, and the lamps of the lamp tower each have a one-to-one correspondence.

3. The alarm system of claim 1, wherein said lamps each emit a different color of light.

4. The alarm system of claim 1, wherein each input signal for the respective operation states in the semiconductor device fabrication facility is inputted into the logical-combination means via a photocoupler.

5. The alarm system of claim 1, wherein the semiconductor device fabrication facility comprises:
   a supply chamber for supplying a cassette having wafers to be processed by a specific process;
   a process chamber for carrying out the specific process; and
   a load lock chamber displaced between the supply chamber and the process chamber for receiving and holding the cassette transferred from the supply chamber.

6. The alarm system of claim 5, wherein the semiconductor device fabrication facility is an ion-implantation facility.

7. An alarm system for a semiconductor device fabrication facility, comprising:
   a logical-combination means for executing logical-combination on receipt of at least one input signal for respective operation states in a specific semiconductor device fabrication facility to produce at least one logical-combination result;
   a driving means for outputting N driving signals on receipt of the result from the logical-combination means, N being an integer number greater than one; and
   a lamp tower receiving said driving signals and having N lamps, each of said lamps corresponding to one of said driving signals, each lamp indicating a particular result for the respective operation states in the semiconductor device fabrication facility,
   wherein the semiconductor device fabrication facility comprises:
      a supply chamber for supplying a cassette having wafers to be processed by a specific process;
      a process chamber for carrying out the specific process; and
      a load lock chamber displaced between the supply chamber and the process chamber for receiving and holding the cassette transferred from the supply chamber,
   wherein the semiconductor device fabrication facility is an ion-implantation facility, and
   wherein the operation states of the fabrication facility inputted to the logical-combination means comprise:
      1) a first state, where the cassette having wafers to be processed is not present inside the supply chamber;
      2) a second state, where the cassette having wafers is present inside the supply chamber;
      3) a third state, corresponding to a time period from a time when the cassette having wafers inside the supply chamber is transferred into the load lock chamber by means of a transfer means, to a time right before ion-impurities are injected into the wafers transferred from the load lock chamber to the process chamber;
      4) a fourth state, where an ion-implantation process is performed for the wafers inside the process chamber;

5) a fifth state, where ion-implantation error occurs during the ion-implantation process;

6) a sixth state, corresponding to a time period from a time when the ion-implantation process for a single wafer is completed, to a time right before the ion-implantation process is resumed for a new wafer.

8. The alarm system of claim 7, the operation states further comprising a seventh state corresponding to a time period from a time when the ion-implantation process is completed for a last wafer, to a time when the wafers are unloaded into the cassette inside the load lock chamber, and the cassette is moved to the supply chamber.

9. The alarm system of the claim 8, wherein the third state, the sixth state, and the seventh state have an identical input signal, and one of the lamps of the lamp tower, corresponding to respective said third, sixth, and seventh states is identically energized for each of said states.

10. The alarm system of claim 7, wherein four input signals are inputted for each of the operation states.

11. The alarm system of claim 10, the four input signals comprising:

a commencement signal (A) which is generated at the third, fourth, and sixth states;

a ready signal (B) which is generated at the second, third, fourth, fifth, and sixth states;

an operation signal (C) which is generated at the first and the fourth states; and a stand-by signal (D) which is generated at the first, the second, and the fifth states.

12. The alarm system of claim 10, wherein the lamp tower has three lamps each-emitting a different color of light.

13. The alarm system of claim 12, wherein the three lamps emit red, green, and yellow light respectively, and the green lamp is turned-on from the third operation state to the sixth operation state.

14. The alarm system of claim 13, wherein the red lamp turns on in the fifth state, with the green lamp also turned-on.

15. The alarm system of claim 14, wherein the red lamp is made to blink by combining a pulse signal having a certain frequency with the result by the logical-combination means to be applied to a driving signal for turning on the red lamp.

* * * * *